(12) United States Patent
Iida et al.

(10) Patent No.: US 10,145,899 B2
(45) Date of Patent: Dec. 4, 2018

(54) BATTERY CLASS DETERMINATION DEVICE AND BATTERY CLASS DETERMINATION METHOD

(71) Applicant: Panasonic Intellectual Property Management Co., Ltd., Osaka (JP)

(72) Inventors: Takuma Iida, Kanagawa (JP); Hiroyuki Jimbo, Aichi (JP); Kazuhiro Sugie, Shizuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/547,716

(22) PCT Filed: Feb. 5, 2016

(86) PCT No.: PCT/JP2016/000600
§ 371 (c)(1),
(2) Date: Jul. 31, 2017

(87) PCT Pub. No.: WO2016/129260
PCT Pub. Date: Aug. 18, 2016

(65) Prior Publication Data
US 2018/0267107 A1    Sep. 20, 2018

(30) Foreign Application Priority Data
Feb. 12, 2015    (JP) .................. 2015-025639

(51) Int. Cl.
*H02J 7/00* (2006.01)
*G01R 31/36* (2006.01)
(Continued)

(52) U.S. Cl.
CPC ...... *G01R 31/3624* (2013.01); *B60L 11/1861* (2013.01); *G01R 31/3637* (2013.01);
(Continued)

(58) Field of Classification Search
CPC ................................................. G01R 31/3624
(Continued)

(56) References Cited

U.S. PATENT DOCUMENTS 7,304,454 B2 * 12/2007 Inui .................. H02J 7/0075
320/149
8,963,506 B2 * 2/2015 Miyazawa ........... G01R 31/361
320/132
(Continued)

FOREIGN PATENT DOCUMENTS

JP    2009-054373 A    3/2009

OTHER PUBLICATIONS

International Search Report of PCT application No. PCT/JP2016/000600 dated Apr. 26, 2016.

*Primary Examiner* — Yalkew Fantu
(74) *Attorney, Agent, or Firm* — Seed IP Law Group LLP

(57) ABSTRACT

A battery class determination device includes a detector for sensing a terminal voltage and charge/discharge currents of a lead storage battery, an inner resistance calculator for calculating a direct-current inner resistance of the lead storage battery based on the terminal voltage and the charge or discharge current sensed by the detector, and a class determiner. The inner resistance calculator calculates, at a switchover between a discharge control and a charge control over the lead storage battery, a direct-current inner resistance in a first period before the switchover, and a direct-current inner resistance in a second period after the switchover. The class determiner determines a class of the lead storage battery based on the direct-current inner resistance in the first period and the direct-current inner resistance in the second period.

10 Claims, 8 Drawing Sheets

(51) Int. Cl.
*H01M 10/44* (2006.01)
*B60L 11/18* (2006.01)
*H02J 7/14* (2006.01)
*H01M 10/48* (2006.01)

(52) U.S. Cl.
CPC ........... *H01M 10/44* (2013.01); *H01M 10/48* (2013.01); *H02J 7/1469* (2013.01)

(58) Field of Classification Search
USPC ........................................................ 320/130
See application file for complete search history.

(56) References Cited

U.S. PATENT DOCUMENTS

| | | | | |
|---|---|---|---|---|
| 2005/0225289 | A1* | 10/2005 | Iida | H01M 10/441 320/116 |
| 2007/0139013 | A1* | 6/2007 | Seo | B60W 10/26 320/130 |
| 2007/0285057 | A1* | 12/2007 | Yano | B60L 3/0046 320/116 |
| 2013/0241480 | A1* | 9/2013 | Kirimoto | B60L 11/1866 320/109 |

* cited by examiner

BATTERY CLASS DETERMINATION DEVICE AND BATTERY CLASS DETERMINATION METHOD

CROSS-REFERENCE TO RELATED APPLICATION

This application is a U.S. national stage application of the PCT International Application No. PCT/JP2016/000600 filed on Feb. 5, 2016, which claims the benefit of foreign priority of Japanese patent application No. 2015-025639 filed on Feb. 12, 2015, the contents all of which are incorporated herein by reference.

BACKGROUND

Technical Field

The present disclosure relates to a battery class determination device and a battery class determination method.

Description of the Related Art

A vehicle driven chiefly by an engine is mounted with a battery as a power source for a starter-motor to start the engine. As the battery, in general, a lead storage battery is employed. Meanwhile, charge/discharge characteristics of lead storage batteries has been improved recently. The lead storage batteries have been thus employed as a power source in special-purpose electric vehicles such as electricity-driven carts and forklifts because if an expensive lithium-ion secondary battery is used in those vehicles, a good paying business cannot be expected.

The most frequent trouble (i.e., the number of mobilizations requested to Japan Automobile Federation) that private cars in Japan encounter is a battery trouble such as dead and lower performance of car batteries. An idling stop system has been employed recently in the vehicles driven chiefly by engines in order to reduce gas emissions from these vehicles. Nevertheless if a lead storage battery to be used in non-idling stop system or a lower grade lead storage battery having poor performance is used in the idling stop system, the system sometimes will not work properly.

To prevent these battery troubles, a determination device that identifies a class of a battery mounted to a vehicle is proposed (e.g., Patent Literature 1).

CITATION LIST

Patent Literature

PTL 1: Unexamined Japanese Patent Application Publication No. 2009-54373

BRIEF SUMMARY

The conventional technique, however, cannot get a proper determination of a battery class. For instance, the battery class determination method disclosed in Patent Literature 1 determines the class is the following way: apply a given voltage across the battery before obtaining an electric-current waveform, then determine the class of the battery with the waveform. According to this method, however, different waveforms are obtained depending on a battery temperature or SOC (state of charge), so that the battery class cannot be determined properly.

The present disclosure aims to provide a battery class determination device and a method for determining a battery class with accuracy.

A battery class determination device in accordance with an aspect of the present disclosure includes the following structural elements:

a detector that senses a terminal voltage and charge/discharge currents of a lead storage battery;

an inner resistance calculator that calculates a direct-current inner resistance of the lead storage battery based on the terminal voltage and the charge or discharge current sensed by the detector; and a class determiner that determines a class of the lead storage battery based on the calculated direct-current inner resistance. The inner resistance calculator calculates a direct-current inner resistance in a first period, and a direct-current inner resistance in a second period at a switchover from a discharge control to a charge control over the lead storage battery, or a switchover from the charge control to the discharge control. In this context, the first period refers to as a period before the switchover and the second period refers to as a period after the switchover and within the given time after the first period. The class determiner determines the class of the lead storage battery based on the direct-current inner resistance in the first period before the switchover and the direct-current inner resistance in the second period after the switchover.

A method for determining a battery class in accordance with an aspect of the present disclosure includes:

sensing a terminal voltage and charge/discharge currents of a lead storage battery;

calculating a direct-current inner resistance of the lead storage battery based on the sensed terminal voltage and the sensed charge or discharge current; and determining a class of the lead storage battery based on the calculated direct-current inner resistance.

When calculating the direct-current inner resistance, a direct-current inner resistance in a first period, and also a direct-current inner resistance in a second period are calculated at a switchover from a discharge control to a charge control over the lead storage battery, or a switchover from the charge control to the discharge control. In this context, the first period refers to as a period before the switchover and the second period refers to as a period after the switchover and within the given time after the first period. When determining the class of the lead storage battery, the class is determined based on the direct-current inner resistance in the first period before the switchover and the direct-current inner resistance in the second period after the switchover.

The present disclosure allows determining the class of the lead storage battery with accuracy.

DETAILED DESCRIPTION

Exemplary embodiments of the present disclosure are detailed hereinafter with reference to the accompanying drawings.

First Exemplary Embodiment

Figure 1:
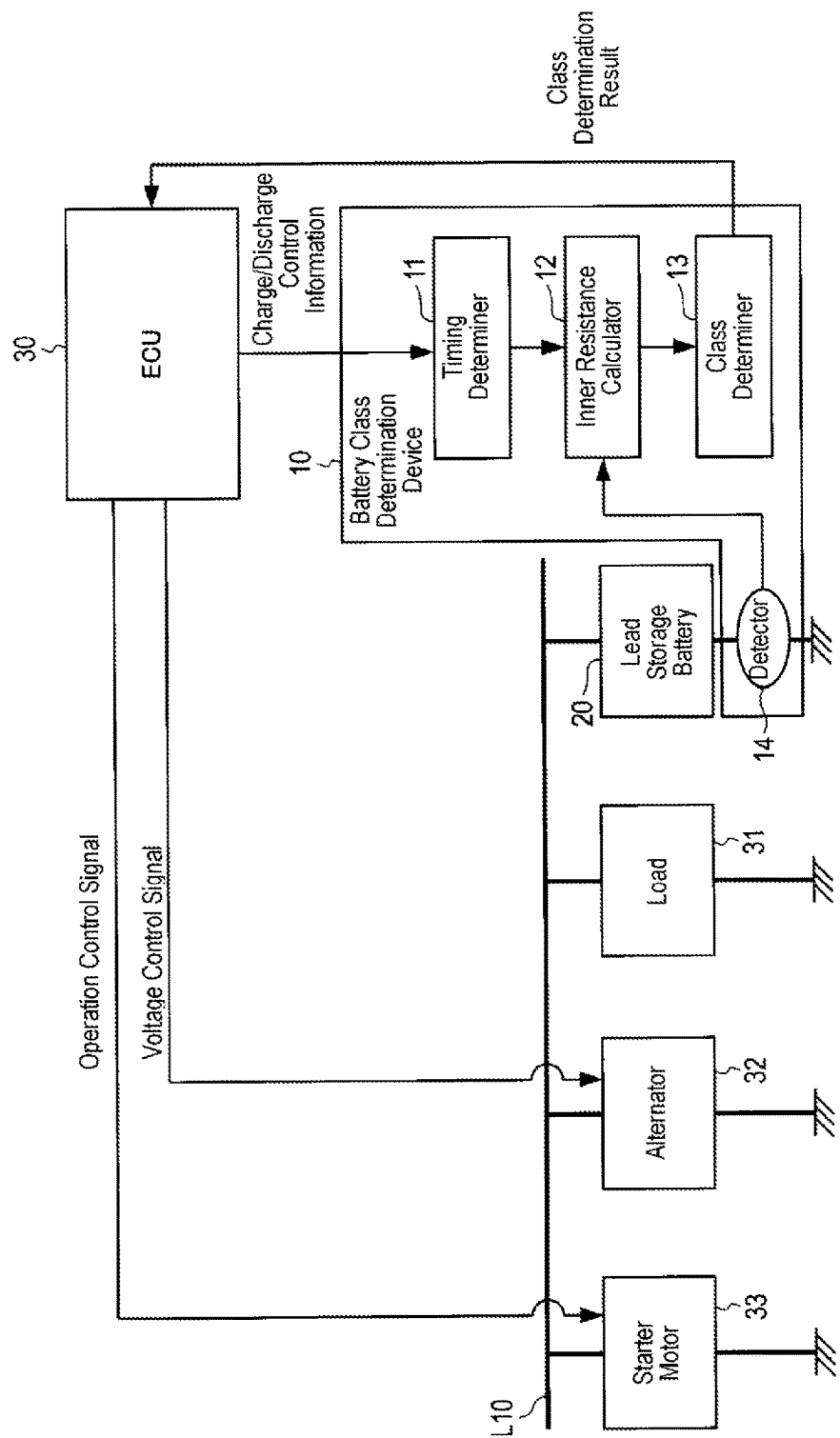
FIG. 1 is a block diagram illustrating a part of a vehicle including a battery class determination device in accordance with a first embodiment of the present disclosure.

FIG. 1 is a block diagram showing a part of a vehicle including a battery class determination device in accordance with the first embodiment.

In the first embodiment, battery class determination device 10 is mounted to a vehicle that is driven chiefly by an engine and includes an idling stop system.

The vehicle includes battery class determination device 10, lead storage battery 20, ECU (Electric Control Unit) 30, load 31, alternator 32, and starter motor 33. The vehicle also includes the engine and drive wheels (not shown).

Starter motor 33 is a motor for starting the engine, and drive of starter motor 33 allows rotating a crank shaft, and starting the engine mechanism before the engine starts working. The crank shaft of the engine is rotated by driving starter motor 33, and this rotation is referred to as cranking. Starter motor 33 starts working by electric power supplied from lead storage battery 20 and based on an operation control signal supplied from ECU 30.

Alternator 32 generates electric power with the rotary power of the crank shaft, however, it can generate electric power with rotary power of the drive wheels. In addition, alternator 32 rectifies the generated electric power, and also adjusts a voltage based on a voltage control signal supplied from ECU 30.

Load 31 is an electric auxiliary machinery (an accessory) necessary for operating the engine. Load 31 includes, for instance, a fuel injection device and a sparking plug. The auxiliary machinery in this context refers to as peripherals of the engine necessary for driving the engine. Load 31 can include various electric devices mounted to a vehicle such as an interior lighting, a meter panel (a dashboard), a lighting device and so on.

Lead storage battery 20 is chargeable and dischargeable, and is charged with the power generated by alternator 32. Lead storage battery 20 supplies electric power to starter motor 33, load 31, ECU 30, and battery class determination device 10.

ECU 30 controls the engine. To be more specific, the control by ECU 30 includes an operation control over starter motor 33, a control over a voltage of the electric power generated by alternator 32, and a control over the auxiliary machinery.

ECU 30 sends the information about the charge/discharge control to battery class determination device 10. Further, ECU 30 receives the information about a determination result on lead storage battery 20, thereby carrying out a control in response to the determination result. For instance, when the determination result shows that the lead storage battery compatible with an idling stop system is used, ECU 30 carries out the control proper to the idling stop system. On the other hand, when the determination result shows that the lead storage battery not compatible with the idling stop system is used, ECU 30 does not carry out the control proper to the idling stop system. If the determination result shows that a lower grade battery (described later) is used, ECU 30 can carry out a control issuing a warning.

Battery class determination device 10 carries out a class determination on lead storage battery 20. In addition, battery class determination device 10 can monitor SOC (state of charge) or a degree of degradation of lead storage battery 20.

Battery class determination device 10 includes timing determiner 11, inner resistance calculator 12, class determiner 13, and detector 14.

The elements of battery class determination device 10, except the elements of detector 14 (e.g., current sensing resistor), can be included in a one-chip semiconductor integrated circuit. Battery class determination device 10, except the elements of detector 14, can be made up of a plurality of semi-conductor circuits. Battery class determination device 10 as a whole, except a part thereof or the elements of detector 14, can be included in one semiconductor integrated circuit together with ECU 30 or other ECUs to be mounted to the vehicle.

Detector 14 senses charge/discharge currents and a voltage of lead storage battery 20, and outputs the sensing signal to inner resistance calculator 12. The voltage to be sensed is a terminal voltage of lead storage battery 20, and is measured during the charging, discharging, and opening of the terminals of battery 20.

Timing determiner 11 determines, based on the charge/discharge control information sent from ECU 30, a timing at which the discharge control is switched to the charge control over lead storage battery 20. Timing determiner 11 sends signals to inner resistance calculator 12 during given periods before and after this switch timing in order to notify inner resistance calculator 12 of those periods.

Inner resistance calculator 12 calculates a direct-current inner resistance of battery 20 based on the charge or discharge current and the voltage sensed by detector 14. A method of calculating the direct-current inner resistance will be described later.

Class determiner 13 determines a class of lead storage battery 20 based on the direct-current inner resistances calculated by inner resistance calculator 12 during the two periods. The class determination will be detailed later. Class determiner 13 notifies ECU 30 of the determination result, nevertheless, it can output the determination result to other control sections. Alternatively, battery class determination device 10 displays the determination result or issues a warning based on the determination result.

Timing of Measuring Inner Resistance

Figure 2:
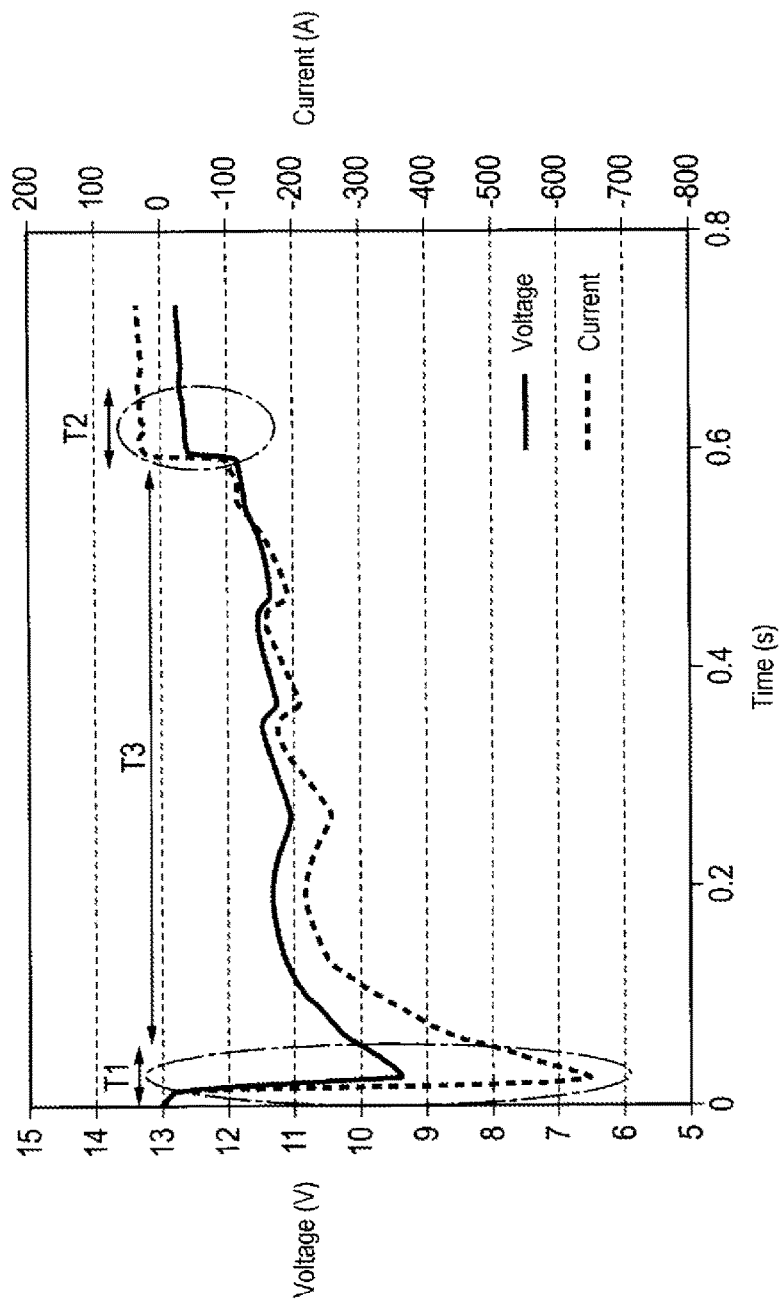
FIG. 2 is a graph showing an example of periods in which a direct-current inner resistance of a lead storage battery is measured in the battery class determination device in accordance with the first embodiment.

FIG. 2 is a graph illustrating an example of the periods each in which a direct-current inner resistance is measured in the battery class determination device in accordance with the first embodiment. This graph shows the variation with time of the charge/discharge currents and the terminal voltage of lead storage battery 20.

As FIG. 2 illustrates, at the switchover from the discharge control when the engine starts working to the first charge control, timing determiner 11 determines that the period is the period in which the control is switched initially from the discharge control to the first charge control after the switchover. In this first embodiment, based on the charge/discharge control information from ECU 30, timing determiner 11 determines that the period is the first one in which the discharge control at the start of the engine is switched initially to the charge control. Furthermore, around this switchover, timing determiner 11 notifies inner resistance calculator 12 of discharge start period T1 during the discharge control and charge start period T2 during the charge control.

During discharge start period T1, starter motor 33 starts working from the engine halt state. During discharge start period T1, lead storage battery 20 supplies a great amount of discharge current for driving starter motor 33 and the crank shaft that have been halted.

Then the crank shaft rotates, and the engine starts working. During period T3 in FIG. 2, the crank shaft is kept rotating by starter motor 33, and the engine starts working. After this period T3, alternator 32 starts charging.

During charge start period T2, alternator 32 starts charging because of the start of the engine, and the charge to lead storage battery 20 starts. Charge start period T2 includes a zero-cross timing at which the charge/discharge currents of battery 20 cross with the zero point. Lead storage battery 20 connects with load 31 via power source line L10, so that the electric power is consumed. Right after the power generation by alternator 32, lead storage battery 20 thus still discharges. The charge to battery 20 starts after the amount of power generation by alternator 32 exceeds the amount of power consumption by load 31. The start of charge control refers to the start of power generation by alternator 32. In a short period right after the start of the charge control, lead storage battery 20 may still discharge, however, the charge to battery 20 starts immediately thereafter.

The time length from discharge start period T1 to charge start period T2 varies depending on vehicles; however, rather small variations can be expected in the same vehicle. This time length is, for instance, within 10 seconds, and it is preferably within 5 seconds, and more preferably it is within 1 second. Such a short time length improves the class determination accuracy of lead storage battery 20.

Inner resistance calculator 12 calculates the direct-current inner resistance of lead storage battery 20 during discharge start period T1 based on the discharge current and the voltage sensed by detector 14 during discharge start period T1. Furthermore, inner resistance calculator 12 calculates the direct-current inner resistance of lead storage battery 20 during charge start period T2 based on the charge current and the voltage sensed by detector 14 during charge start period T2.

Method for Calculating Inner Resistance

Figure 3:
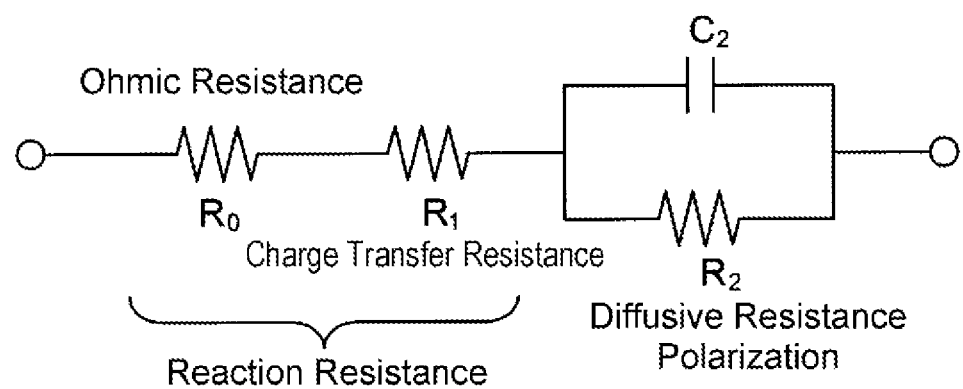
FIG. 3 shows an equivalent circuit model to the lead storage battery.

FIG. 3 shows an equivalent circuit model to the lead storage battery.

Inner resistance calculator 12 includes, for example, the equivalent circuit model, shown in FIG. 3, to the lead storage battery, and a well-known filter such as Kalman filter.

The equivalent circuit model to the lead storage battery shown in FIG. 3 is made up of parameters of a reaction resistance which is a sum of ohmic resistance $R_0$ and charge-transfer resistance $R_1$ in the positive and negative electrodes, resistance component $R_2$ and capacitor component $C_2$ of the primary equivalent circuit showing a diffusive resistance polarization.

Inner resistance calculator 12 sequentially estimates the parameters of the equivalent circuit model based on the discharge current values and the voltage values both sensed by detector 14 at multiple timings during discharge start period T1, thereby calculating the direct-current inner resistance of lead storage battery 20 during discharge start period T1.

In a similar way to what is discussed above, inner resistance calculator 12 sequentially estimates the parameters of the equivalent circuit model based on the charge current values and the voltage values sensed by detector 14 at multiple timings during charge start period T2, thereby calculating the direct-current inner resistance of lead storage battery 20 during charge start period T2.

The equivalent circuit model to the lead storage battery is not always the example shown in FIG. 3. The example shown in FIG. 3 is an equivalent circuit model expressed with only a resistance component of a faster response, while a capacitance component of the faster response is omitted from a parallel circuit made up of the resistance component of the faster response and the capacitance component of the faster response. According to the equivalent circuit model to the lead storage battery shown in FIG. 3, an accurate estimation can be carried out through the use of a current value and a voltage value obtained by cutting a faster response component of a signal supplied from detector 14 with an LPF (low pass filter). An equivalent circuit model including a capacitance component of a faster response can be adopted as the equivalent circuit model to the lead storage battery, and use of this equivalent circuit model allows calculating the direct-current inner resistance.

Figure 4:
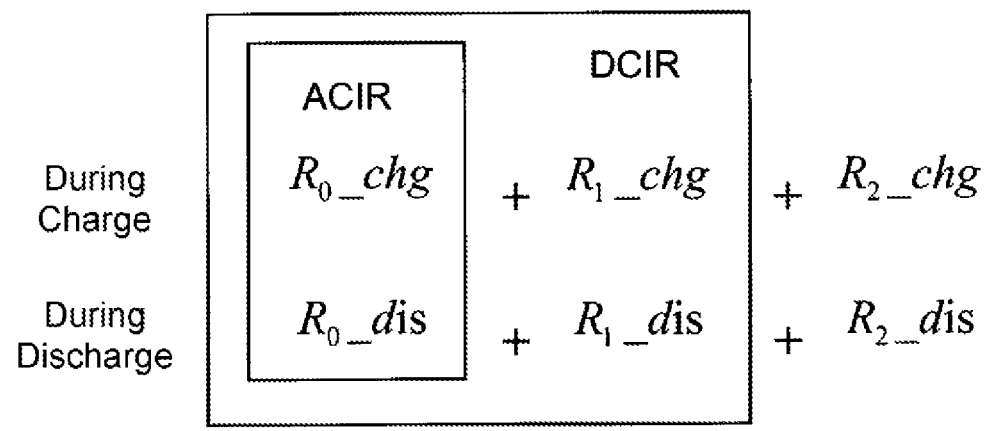
FIG. 4 schematically shows a resistance component when the lead storage battery is charged and discharged.

A correspondence relation between the equivalent circuit model to the lead storage battery shown in FIG. 3 and the direct-current inner resistance calculated by inner resistance calculator 12 is described hereinafter. FIG. 4 schematically shows the resistant components during the charge period and the discharge period.

As FIG. 4 shows, ohmic resistance $R_0\_chg$ during the charge period corresponds to the alternative-current inner resistance (ACIR) during the charge period, and ohmic resistance $R_0\_dis$ during the discharge period corresponds to the alternative-current inner resistance during the discharge period. The reaction resistance which is the sum of ohmic resistance $R_0\_chg$ during the charge period and charge transfer resistance $R_1\_chg$ in the positive electrode and the negative electrode corresponds to the direct-current inner resistance (DCIR) during the charge period, and a reaction resistance which is the sum of ohmic resistance $R_0\_dis$ during the discharge period and charge transfer resistance $R_1\_dis$ in the positive electrode and the negative electrode corresponds to the direct-current inner resistance (DCIR) during the discharge period. Since R2_chg indicating a diffusive resistance polarization during the charge period and R2_dis indicating a diffusive resistance polarization during the discharge period are resistant components of slower components, they are not included in DCIR that is formed by a short time reaction. As discussed above, the resistant component of a faster response of the equivalent circuit model can be readily calculated as the direct-current inner resistance formed of the ohmic resistance and the charge transfer resistance in the positive and negative electrodes.

Class Determination

The classes of lead storage battery 20 to be determined include a lead storage battery compatible with ISS (idling stop system), a lead storage battery not compatible with ISS, and a lower grade lead storage battery. In other words, the lead storage battery not compatible with ISS is a regular lead storage battery, and the lower grade battery is inferior in performance to the regular lead storage battery. The performance of the battery in this context chiefly refers to a service life of the battery. The service life is affected by a value of direct-current inner resistance during the charge period. For instance, the greater direct-current inner resistance (DCIR) during the charge period will shorten the service life of the battery.

The lead storage battery compatible with ISS needs to be used as long as for several years in general when employed in a vehicle compatible with ISS. For instance, Battery Association Standard specifies the required durability of 30,000 cycles or more (actually 3 years or longer) in its article SBA S 0101.

The lead storage battery not compatible with ISS having the same size to that compatible with ISS has a shorter service life than that compatible with ISS. For instance, a regular lead storage battery to be used for starting an engine has a service life of approx. 1.5 years.

The lower grade lead storage battery is, for example, a weight-oriented lead storage battery that contains less amount of active material than the regular type in order to reduce the weight of the battery for rationalization. Use of this lower grade battery for starting routinely an engine will allow this battery to serve less than one year (e.g., approx. 0.5 year).

If the lead storage battery not compatible with ISS or the lower grade lead storage battery is mounted by mistake to a vehicle compatible with ISS, this vehicle encounters a risk of not passing an official vehicle inspection or other inspections to be done yearly basis. It is thus necessary to determine the class of the lead storage battery mounted to the ISS compatible vehicle.

The direct-current inner resistance during the charge period and that during the discharge period depend on battery classes. Since the lead storage battery not compatible with ISS has a lower capability of receiving the charge, the direct-current inner resistance during the charge period becomes greater than that during the discharge period while a state of charge (SOC) is high. The lower grade lead storage battery has still lower capability of receiving the charge, because it is affected by $R_1\_chg$ indicating the reaction resistance of a faster response component. On the other hand, the lead storage battery compatible with ISS has improved capability of receiving the charge from the lead storage battery of regular type, so that the direct-current inner resistance during the charge period is lower than that during the charge period of the lead storage battery not compatible with ISS. As a result, $R_1\_chg$ indicating the reaction resistance of the faster response component is smaller than that of the lead storage battery not compatible ISS or the lower grade lead storage battery.

Inner resistance calculator 12 sends a value of the direct-current inner resistance during discharge start period T1 and a value of the direct-current inner resistance during charge start period T2 to class determiner 13, which then calculates, for instance, a difference between the direct-current inner resistance value during period T1 and the direct-current inner resistance value during period T2, and compares this difference with a first threshold and a second threshold, thereby determining the class of lead storage battery 20.

Since the ohmic resistance varies in a small amount between the charge period and the discharge period (i.e., $R_0\_chg$ is nearly equal to $R_0\_dis$), use of a difference between DCIR during the charge period and DCIR during the discharge period allows specifying a difference between the reaction resistance during the charge period and the reaction resistance during the discharge period (i.e., $R_1\_chg-R_1\_dis$) because the influence of the ohmic resistance can be canceled. When the difference between the reaction resistance during the charge period and the reaction resistance during the discharge period (i.e., $R_1\_chg-R_1\_dis$) is greater than the given first threshold, class determiner 13 recognizes that the reaction resistance $R_1\_chg$ is relatively large, thereby determining the class to be the lead storage battery not compatible with ISS or the lower grade lead storage battery. On the other hand, when the difference between the reaction resistance during the charge period and the reaction resistance during the discharge period (i.e., $R_1\_chg-R_1\_dis$) is equal to or smaller than the given first threshold, class determiner 13 recognizes that that the reaction resistance $R_1\_chg$ is relatively small, thereby determining the class to be the lead storage battery compatible with ISS.

Furthermore, when the difference between the reaction resistance during the charge period and the reaction resistance during the discharge period (i.e., $R_1\_chg-R_1\_dis$) is greater than the given first threshold, and yet greater than a given second threshold, class determiner 13 recognizes that reaction resistance R1_chg during the charge period is further large, thereby determining the class to be the lower grade lead storage battery. When the difference between the reaction resistance during the charge period and the reaction resistance during the discharge period (i.e., $R_1\_chg R_1\_dis$) is equal to or smaller than the given second threshold, and yet greater than the given first threshold, class determiner 13 recognizes that reaction resistance R1_chg during the charge period is moderate, thereby determining the class to be the lead storage battery not compatible with ISS. The second threshold in this context is set greater than the first threshold.

For the purpose of determining the class, class determiner 13 is not limited to comparing the difference between the direct-current inner resistance during discharge start period T1 and the direct-current inner resistance during charge start period T2 with the threshold. For instance, in order to determine the class, class determiner 13 can compare a ratio of the direct-current inner resistance during charge start period T2 with respect to the direct-current inner resistance during discharge start period T1 with a threshold. In other words, class determiner 13 determines whether the direct-current inner resistance during charge start period T2 is close to or far from the direct-current inner resistance during discharge start period T1, and if they are close to each other, the class is determined to be a lead storage battery of better performance, and if they are far from each other, the class is determined to be a lead storage battery of inferior performance. The lead storage batteries are ranked in performance from the higher one to the lower one in this order: the lead storage battery compatible with ISS, the lead storage battery not compatible with ISS, and the lower grade lead storage battery.

As discussed above, battery class determination device 10 in accordance with the first embodiment calculates, when the discharge control is switched from the discharge control to the charge control, the direct-current inner resistance of lead storage battery 20 during discharge start period T1 before the switchover, and also calculates the direct-current inner resistance of lead storage battery 20 during the second period after the switchover and yet within a given time from the first period (e.g., within one second, and within ten seconds is acceptable). Then, determination device 10 compares the direct-current inner resistance during discharge start period T1 with the direct-current inner resistance during charge start period T2, thereby determining the class of lead storage battery 20. The timings of measuring these two direct-current inner resistances are thus specified, so that a situation in which a greater error caused by other factors can be eliminated. As a result, the class of lead storage battery 20 can be determined accurately.

Moreover, battery class determination device 10 in accordance with the first embodiment measures the direct-current inner resistance of lead storage battery 20 at the discharge start time at which starter motor 33 is started before the engine starts working, and also it measures the direct-current inner resistance of lead storage battery 20 at the charge start time right after the engine starts working. This procedure thus allows preventing changes in the environment of the lead storage battery, so that the measurement of the direct-current inner resistance cannot be affected every time when the direct-current inner resistance is measured under various situations for the class determination. Use of the direct-current inner resistance values thus measured under the condition where the timings of measuring the direct-current inner resistance are specified allows the class determination of lead storage battery 20 to be more accurately.

Second Exemplary Embodiment

Figure 5:
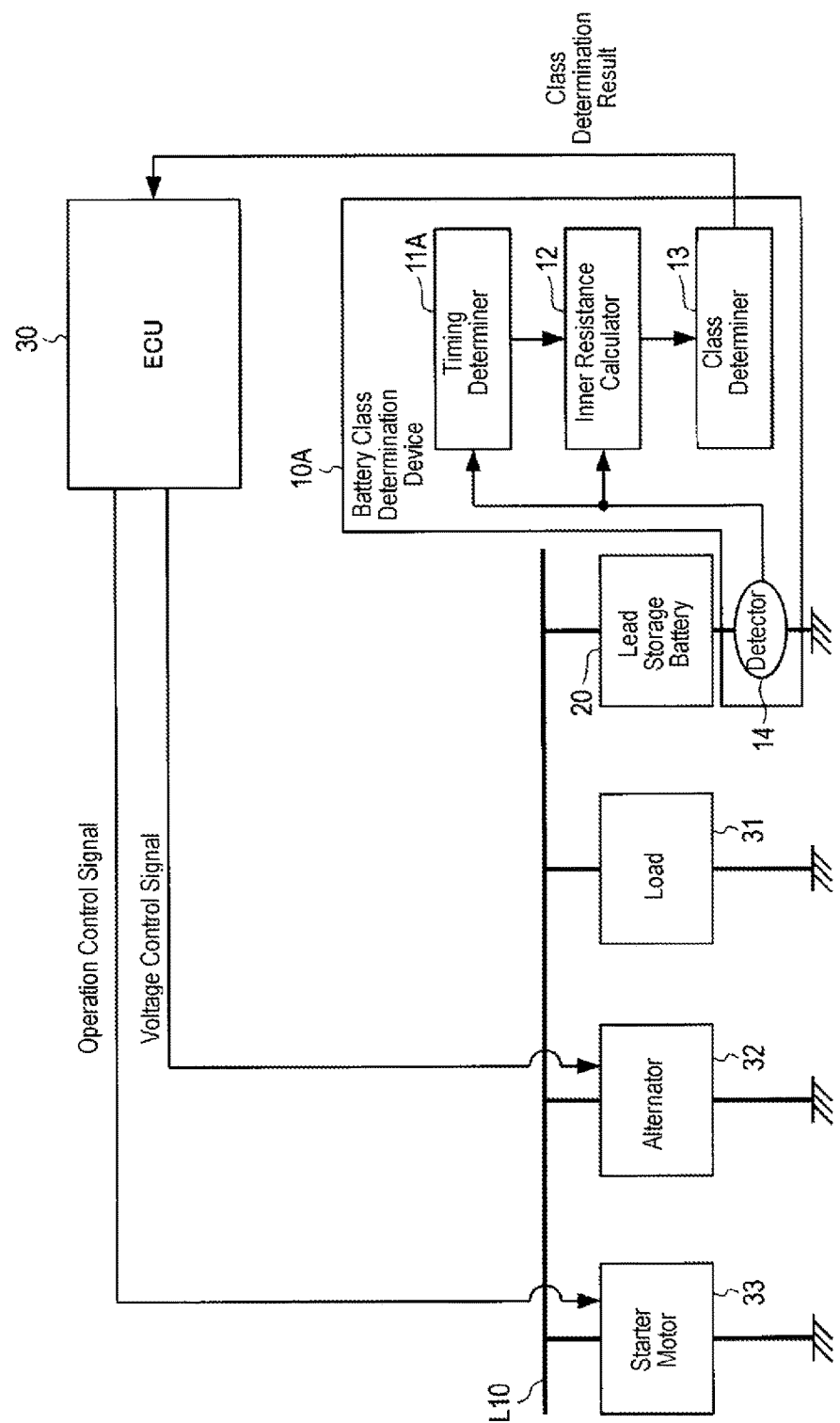
FIG. 5 is a block diagram showing a part of a vehicle including a battery class determination device in accordance with a second embodiment of the present disclosure.

FIG. 5 is a block diagram illustrating a part of a vehicle including a battery class determination device in accordance with the second embodiment.

Battery class determination device 10A in accordance with the second embodiment is made up of the same structural elements as those described in the first embodiment except an input to timing determiner 11A. The same structural elements have the same reference marks as those used in the first embodiment, and detailed descriptions thereof are omitted here.

Timing determiner 11A in accordance with the second embodiment receives a signal supplied from detector 14, and monitors chiefly sensing signals of charge/discharge currents from detector 14. Timing determiner 11A determines, after high power is discharged from lead storage battery 20, a period during which lead storage battery 20 is being charged within a given time. In this context, "within a given time" refers to preferably within 10 seconds, more preferably within 5 seconds, still more preferably within one second. Timing determiner 11A then makes inner resistance calculator 12 to calculate the direct-current inner resistances of lead storage battery 20 during the discharge period T1 and the charge period T2. It is preferable to prepare a memory for storing the signals supplied from detector 14 within a predetermined time. After the switchover from a discharge control to a charge control is sensed, use of the stored data allows calculating the direct-current inner resistances during the discharge control period before the switchover and the charge control period after the switchover.

Furthermore, timing determiner 11A in accordance with the second embodiment monitors the waveforms of charge/discharge currents and the waveform of voltage, thereby determining the period of switchover from the discharge control to the charge control at the engine start (cranking) time shown in FIG. 2. Battery class determination device 10A in accordance with the second embodiment thus can also determine the class through the calculations of the direct-current inner resistances of lead storage battery 20 in both discharge start period T1 at the engine start time and charge start period T2 right after period T1 shown in FIG. 2.

Timing determiner 11A can determine the foregoing timing based on at least one of the charge/discharge currents and the voltage of lead storage battery 20. For instance, use of the charge/discharge currents allows timing determiner 11A to determine the switchover between the discharge control and the charge control through sensing a zero-cross at which the charge/discharge currents cross with the zero point. Timing determiner 11A can also determine the switchover between the discharge control and the charge control when a change rate of the voltage is equal to or greater than a given threshold (e.g., equal to or greater than 1 V/s). In this context, the change rate of the voltage shows a variation per unit time in the voltage.

The calculation of the inner resistance by inner resistance calculator 12 and the action of class determiner 13 based on calculation result remain the same as those described in the first embodiment.

As discussed above, even no information about the charge/discharge controls is available from ECU 30 of the vehicle, battery class determination device 10A in accordance with the second embodiment can determine the class in a similar manner to what is discussed in the first embodiment.

Third Exemplary Embodiment

Figure 6:
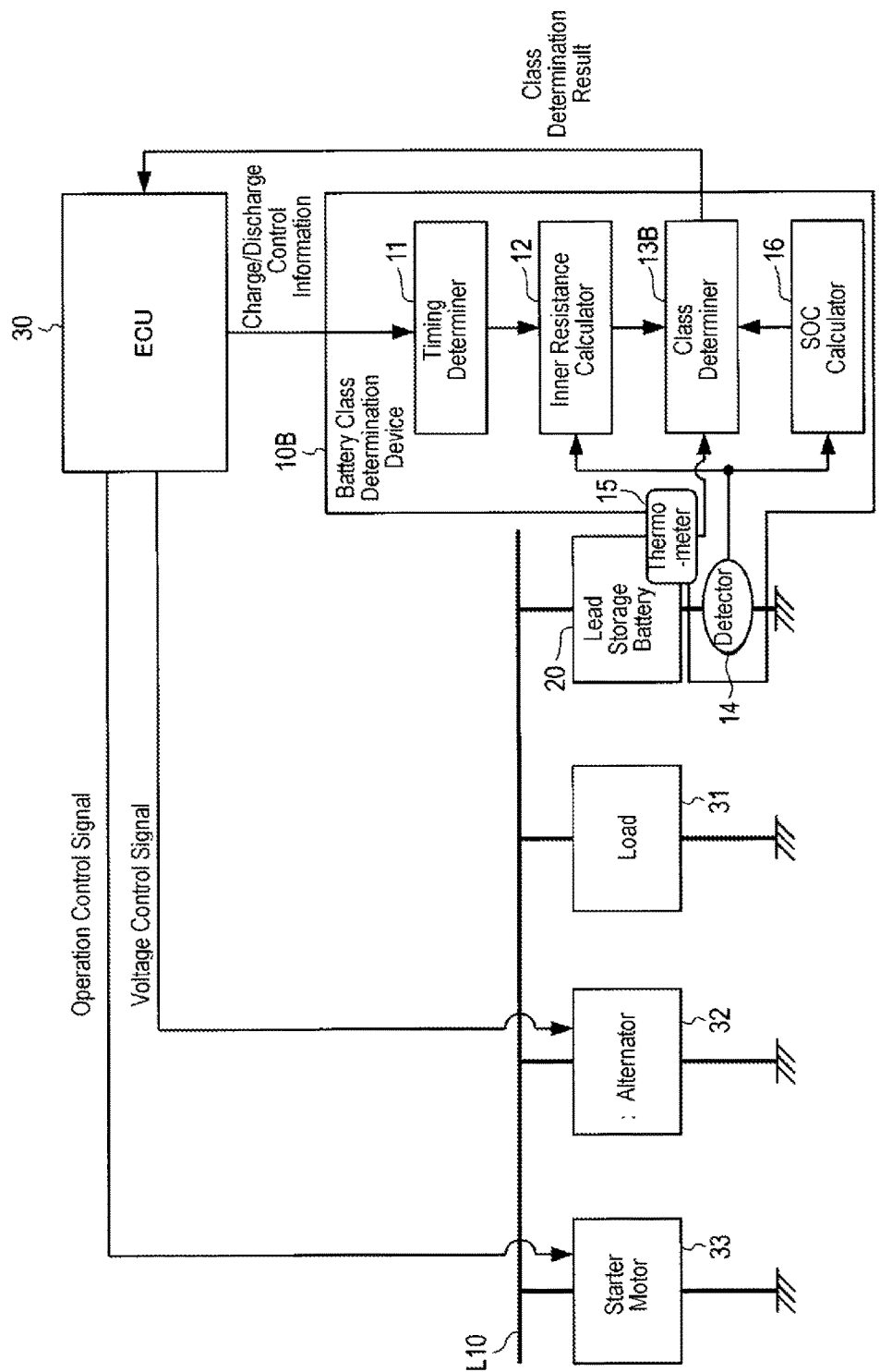
FIG. 6 is a block diagram showing a part of a vehicle including a battery class determination device in accordance with a third embodiment of the present disclosure.

FIG. 6 is a block diagram illustrating a part of a vehicle including a battery class determination device in accordance with the third embodiment.

Battery class determination device 10B in accordance with the third embodiment uses not only the direct-current inner resistance, but also a temperature and information about an SOC (State of Charge) of lead storage battery 20 for determining the class of lead storage battery 20. The other structures of determination device 10B remain the same as those described in the first embodiment. Structural elements similar to those used in the first embodiment have the same reference marks and the detailed descriptions thereof are omitted here.

Battery class determination device 10B in accordance with the third embodiment includes thermometer 15 for measuring the temperature of lead storage battery 20, and SOC calculator 16 for calculating the SOC, in addition to timing determiner 11, inner resistance calculator 12, class determiner 13B, and detector 14.

Class determiner 13B in accordance with the third embodiment receives a value of the direct-current inner resistance of lead storage battery 20 during discharge control period T1 before the switchover and a value of the direct-current inner resistance during charge control period T2 after the switchover. These values are supplied from inner resistance calculator 12 at the switchover from the discharge control to the charge control. This procedure is similar to what is discussed in the first embodiment. In addition, class determiner 13B receives a detection signal output from thermometer 15 and a calculation result by SOC calculator 16 when determining the class.

Class determiner 13B carries out the class determination described in the first embodiment; however, if the lead storage battery has an abnormally high temperature, or abnormally low temperature, class determiner 13B will not carry out the class determination. Furthermore, if the SOC falls outside a given range, class determiner 13B will not carry out the class determination.

As discussed above, class determiner 13B will not carry out the class determination in the case where the temperature or the SOC falls outside the given ranges. As a result, the battery class can be determined more accurately.

Class determiner 13B can use an OCV (Open Circuit Voltage) of the lead storage battery instead of the SOC. It can also use all of the SOC, OCV, and temperature, or it can use either one of them.

As discussed above, class determiner 13B is formed such that it will not carry out the class determination if the temperature, the SOC, or the OCV falls outside the given range. Here is another structure of class determiner 13B, viz. it will correct the value of the direct-current inner resistance depending on the temperature, the SOC, or the OCV before carrying out the class determination.

Battery class determination device 10B in accordance with the third embodiment thus can determine the battery class more accurately.

Fourth Exemplary Embodiment

Figure 7:
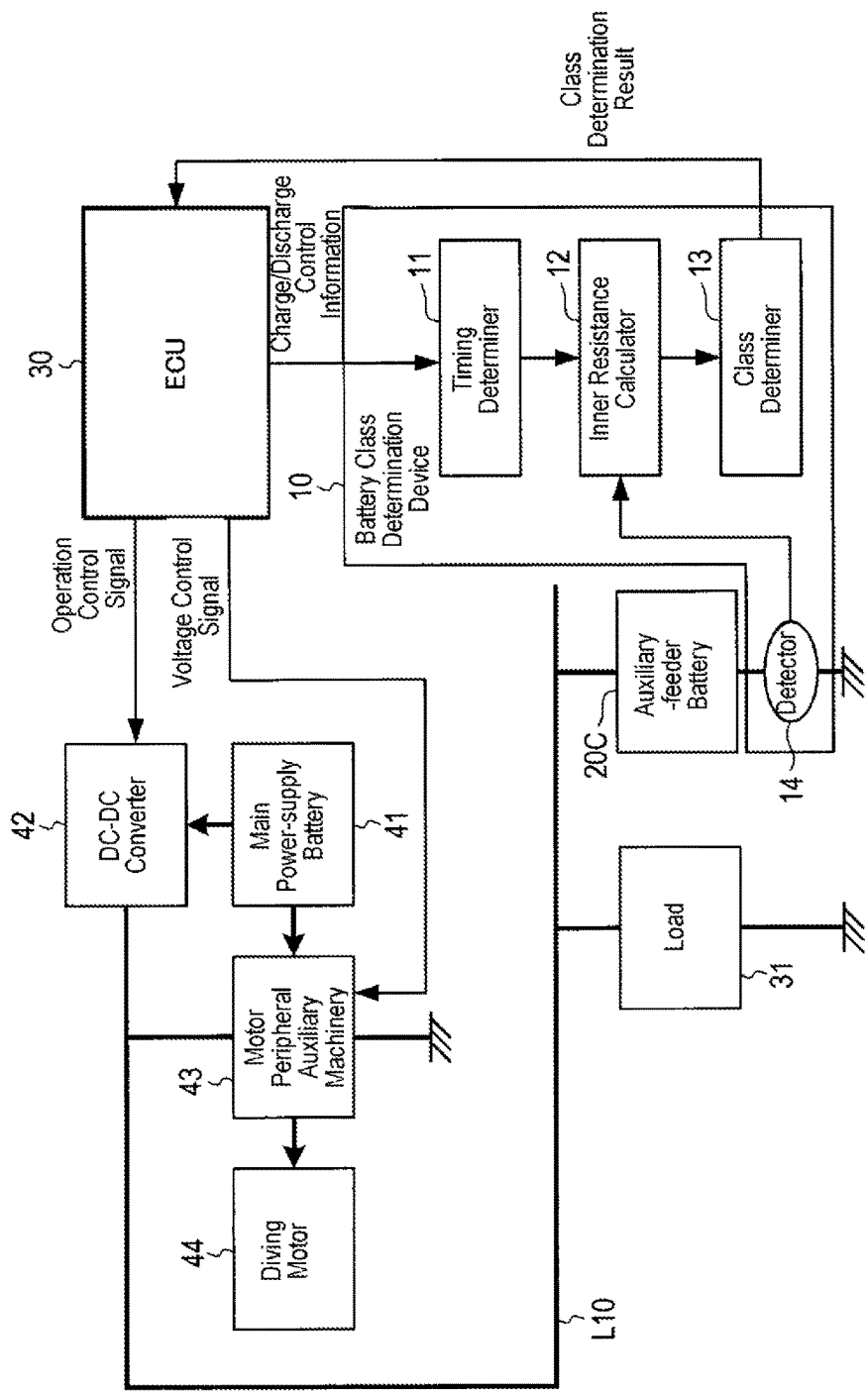
FIG. 7 is a block diagram showing a part of a vehicle including a battery class determination device in accordance with a fourth embodiment of the present disclosure.

FIG. 7 is a block diagram illustrating a part of a vehicle including a battery class determination device in accordance with the fourth embodiment.

The fourth embodiment exhibits an example in which battery class determination device 10 discussed in the first embodiment is mounted to an electric-power driven vehicle such as a hybrid electric vehicle (HEV), plug-in hybrid electric vehicle (PHEV), and electric vehicle (EV).

The vehicle includes main power-supply battery 41, DC-DC converter 42, motor peripheral auxiliary machinery 43, drive motor 44, and auxiliary-feeder battery 20C.

Main power-supply battery 41 is, for example, a lithium-ion battery, and supplies high-power to drive motor 44 for driving the vehicle.

DC-DC converter 42 lowers the voltage of main power-supply battery 41 and outputs the power of main power-supply battery 41 to power-supply line L10. Accordingly, DC-DC converter 42 can feed load 31 with electric power, and charge auxiliary-feeder battery 20C. DC-DC converter 42 is controlled by, for example, ECU 30.

Motor peripheral auxiliary machinery 43 is necessary for driving the drive motor 44, and includes, for instance, a relay switch for opening or closing a connection between a power line of main power-supply battery 41 and a power line of drive motor 44 (and its inverter circuit). Motor peripheral auxiliary machinery 43 is driven by the electric power supplied from auxiliary-feeder battery 20C, based on the control by ECU 30.

Auxiliary-feeder battery 20C is a lead storage battery, and the class thereof is to be determined by battery class determination device 10.

Figure 8:
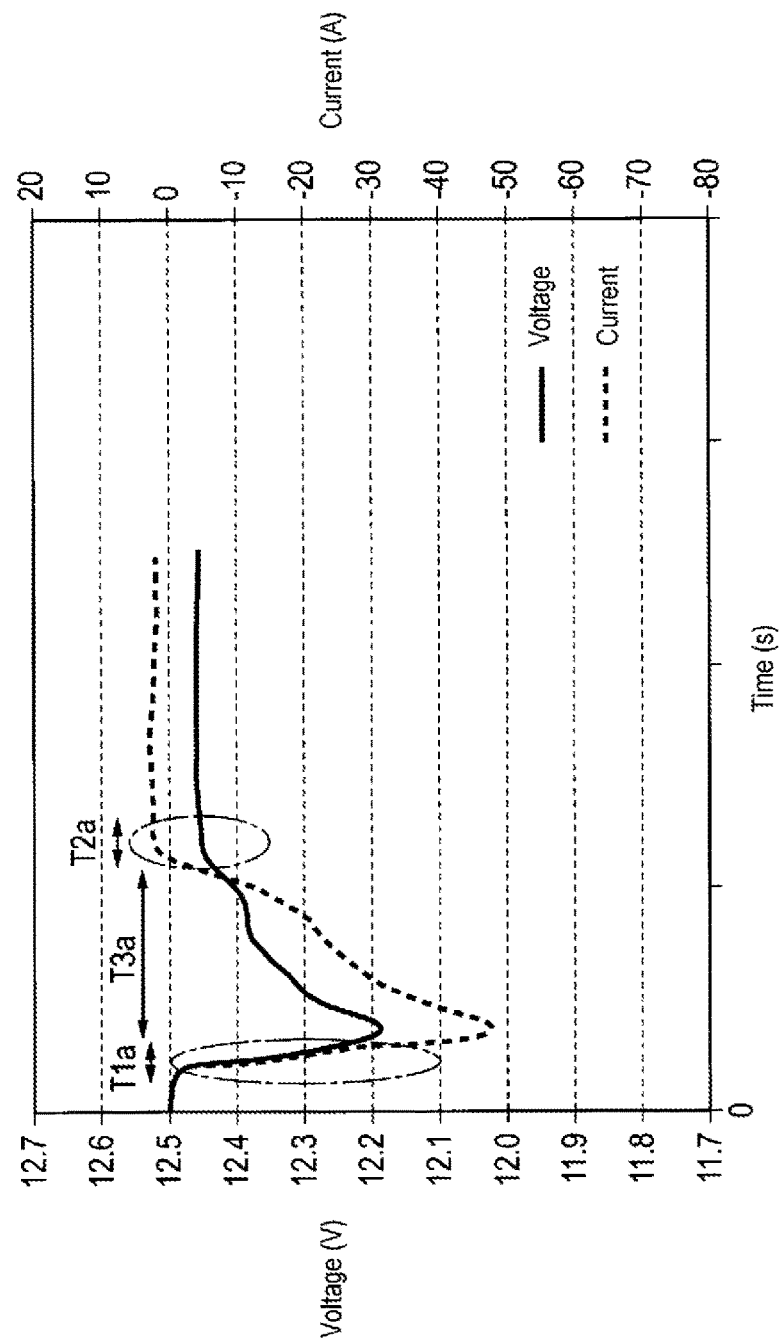
FIG. 8 is a graph showing periods in which a direct-current inner resistance of an auxiliary-feeder battery is measured in the battery class determination device in accordance with the fourth embodiment.

FIG. 8 is a graph showing a first example of a period during which the direct-current inner resistance of the battery is measured by the battery class determination device in accordance with the fourth embodiment. This graph shows variation with time of charge/discharge currents and a terminal voltage of auxiliary-feeder battery 20C. The graph lines in FIG. 8 are not drawn with actually measured values but are drawn schematically with estimated values.

Before the vehicle used in the fourth embodiment is started, motor peripheral auxiliary machinery 43 is firstly driven, as period T1a shows, with the electric power supplied from auxiliary-feeder battery 20C. Accordingly, main power-supply battery 41 can feed drive motor 44 with electric power. During period T3a that follows period T1a, drive motor 44 is driven by the power supplied from main power-supply battery 41, then during period T2a that follows period T3a, main power-supply battery 41 charges auxiliary-feeder battery 20C via DC-DC converter 42.

When the vehicle is started with drive motor 44, a switchover from a discharge control to a charge control also takes place in auxiliary-feeder battery 20C. These series of actions necessary for starting the vehicle with drive motor 44 are sometimes referred to as cranking.

ECU 30 sends information to timing determiner 11 of battery class determination device 10. This information includes information about the discharge control (drive control over motor peripheral auxiliary machinery 43) for auxiliary-feeder battery 20C when drive motor 44 starts the vehicle, and information about the charge control for auxiliary-feeder battery 20C.

At the switchover from the discharge control over battery 20C, when the vehicle starts, to the charge control that takes place firstly after this discharge control, timing determiner 11 notifies inner resistance calculator 12 of discharge start period T1a under the discharge control and charge start period T2a under the charge control.

The actions taken by inner resistance calculator 12 based on the notification of period T1a and period T2a are similar to what is discussed in the first embodiment. A time length of period T3a extending between period T1a and period T2a is, for example, within 10 seconds, preferably within 5 seconds, and more preferably within 1 second. These time lengths allow increasing the accuracy of determining the class of auxiliary-feeder battery 20C. Class determiner 13 carries out a determination process, based on the two direct-current inner resistances calculated before and after the switchover, in a similar way to what is discussed in the first embodiment.

Battery class determination device 10 in accordance with the fourth embodiment achieves an accurate determination of the class of auxiliary-feeder battery 20C mounted to the vehicle driven by drive motor 44.

Modified Embodiment

Figure 9:
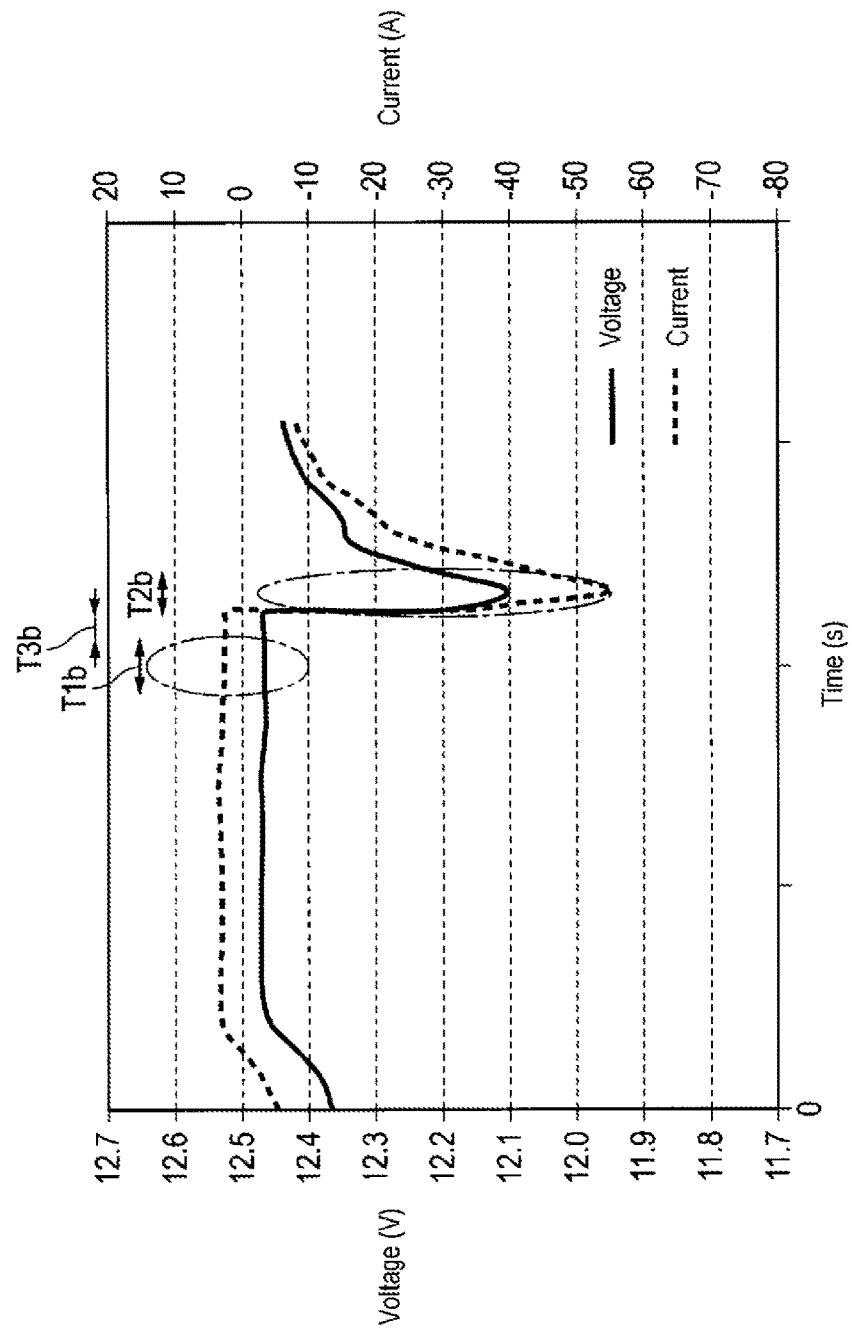
FIG. 9 is a graph showing a modified embodiment of periods in which a direct-current inner resistance of an auxiliary-feeder battery is measured in the battery class determination device in accordance with the fourth embodiment.

FIG. 9 is a graph illustrating a modified example of periods during which the direct-current inner resistance of the battery is measured by the battery class determination device in accordance with the fourth embodiment. This graph shows variation with time of charge/discharge currents and a terminal voltage of auxiliary-feeder battery 20C. The graph lines shown in FIG. 9 are not drawn with actually measured values but are drawn schematically with estimated values.

This modified example employs a period around the switchover from the charge control to the discharge control as the period during which the direct-current inner resistances of auxiliary-feeder battery 20C (lead storage battery) are measured.

In the vehicle mounted with drive motor 44, main power-supply battery 41 charges auxiliary-feeder battery 20C with electricity at a constant voltage (i.e., CV charge), and a discharge test can be done on auxiliary-feeder battery 20C during the CV charge or at the end of the CV charge. Period T1b shown in FIG. 9 is a part of the CV charge period. Period T2b shown in FIG. 9 is a discharge test period.

In this modified example, timing determiner 11 notifies inner resistance calculator 12 of period T1b in the CV charge period on auxiliary-feeder battery 20C, and discharge test period T2b.

Inner resistance calculator 12 and class determiner 13 take actions based on the notification of periods T1b and T2b. These actions are similar to what is discussed in the first embodiment. Time length T3b between period T1b and period T2b is, for instance, within 10 seconds, more preferably within 5 seconds, and still more preferably within 1 second. These time lengths achieve a highly accurate class determination of auxiliary-feeder battery 20C.

According to this modified example, the timings of measuring the two direct-current inner resistances is specified in period T1b before the switchover from the charge control to the discharge control and in period T2b after the switchover. This specification prevents a measured value of the direct-current inner resistance from being added with a serious error caused by other factors. As a result, the class of auxiliary-feeder battery 20C can be determined accurately.

The determination process using the period of switchover from the charge control to the discharge control can be applicable to not only the vehicles mounted with drive motor 44 but also engine-driven vehicles.

Embodiments of the present disclosure have hereinbefore been described.

The present disclosure is not limited to the specific structures or methods demonstrated in the foregoing embodiments, but it can be changed as long as the changes fall within the scope of the gist of the present disclosure.

INDUSTRIAL APPLICABILITY

The present disclosure is applicable to, for instance, a device that determines a battery class of a lead storage battery mounted to a vehicle.

REFERENCE MARKS IN THE DRAWINGS

10, 10A, 10B battery class determination device
11, 11A timing determiner
12 inner resistance calculator
13, 13B class determiner
14 detector
15 thermometer
16 SOC calculator
20 lead storage battery
20C auxiliary-feeder battery
T1, T1a discharge start period (first period)
T2, T2b charge start period (second period)
T1b constant voltage charge period (first period)
T2b discharge test period (second period)
32 alternator
33 starter motor
41 main power-supply battery
42 DC-DC converter
43 motor peripheral auxiliary machinery The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A battery class determination device comprising:
 a detector that senses a terminal voltage and charge/discharge currents of a lead storage battery;
 an inner resistance calculator that calculates a direct-current inner resistance of the lead storage battery based on the terminal voltage and the charge or discharge current sensed by the detector; and
 a class determiner that determines a class of the lead storage battery based on the direct-current inner resistance calculated,
 wherein at a switchover from a discharge control to a charge control or from a charge control to a discharge control over the lead storage battery, the inner resistance calculator calculates the direct-current inner resistance of the lead storage battery during a first period before the switchover and also calculates the direct-current inner resistance of the lead storage battery during a second period after the switchover and yet within a given time from the first period, and
 wherein the class determiner determines the class of the lead storage battery based on the direct-current inner resistance during the first period before the switchover and the direct-current inner resistance during the second period after the switchover.

2. The battery class determination device according to claim 1, further comprising:
 an information receiver that receives control information from a control device controlling charge and discharge of the lead storage battery; and
 a timing determiner that determines a timing of the switchover from the discharge control to the charge control over the lead storage battery or a timing of the switchover from the charge control to the discharge control over the lead storage battery, based on the control information supplied to the information receiver,
 wherein the inner resistance calculator calculates the direct-current inner resistance during the first period and the direct-current inner resistance during the second period, based on a determination by the timing determiner.

3. The battery class determination device according to claim 1, further comprising a timing determiner that determines a timing of the switchover from the discharge control to the charge control over the lead storage battery, or a timing of the switchover from the charge control to the discharge control over the lead storage battery, based on at least one of the charge current, the current and the voltage sensed by the detector,
 wherein the inner resistance calculator calculates the direct-current inner resistance during the first period and the direct-current inner resistance during the second period, based on a determination by the timing determiner.

4. The battery class determination device according to claim 1,
 wherein the lead storage battery supplies electric power for driving an auxiliary machinery of a vehicle, and
 the inner resistance calculator calculates the direct-current inner resistance during the first period and the direct-current inner resistance during the second period at a switchover from a discharge control to a charge control over the lead storage battery when the vehicle starts working.

5. The battery class determination device according to claim 4,
 wherein the vehicle has an engine to be started by driving a starter motor as the auxiliary machinery,
 the lead storage battery supplies electric driving power to the starter motor, and
 wherein the inner resistance calculator calculates the direct-current inner resistance during the first period and the direct-current inner resistance during the second period, at the switchover from the discharge control to the charge control over the lead storage battery when the engine is started.

6. The battery class determination device according to claim 4,
 wherein the vehicle is an electricity-driven vehicle having a drive motor to be started with electric power supplied from a main power-supply battery, the supply of electric power being achieved by driving the auxiliary machinery, the lead storage battery feeds electric power to the auxiliary machinery of the electricity-driven vehicle, and wherein the inner resistance calculator calculates the direct-current inner resistance during the first period and the direct-current inner resistance during the second period, at the switchover from the discharge control to the charge control over the lead storage battery when the drive motor is started.

7. The battery class determination device according to claim 1, further comprising an additional detector that senses at least any one of a charged amount of electricity, an open circuit voltage, and a temperature of the lead storage battery, wherein the class determiner determines the class of the lead storage battery, further based on information including an additional result sensed by the additional detector.

8. The battery class determination device according to claim 1, wherein the class determiner determines the class of the lead storage battery among a lead storage battery compatible with idling stop system, a lead storage battery not compatible with the idling stop system, and a lead storage battery of lower performance than the lead storage battery not compatible with the idling stop system.

9. The battery class determination device according to claim 1, wherein the class determiner determines the class of the lead storage battery as a class of better performance with a smaller difference between the direct-current inner resistance during the first period and the direct-current inner resistance during the second period.

10. A method for determining a class of a battery, the method comprising:

sensing a terminal voltage and charge/discharge currents of the lead storage battery;

calculating a direct-current inner resistance of the lead storage battery based on the sensed terminal voltage and the sensed charge or discharge current; and determining the class of the lead storage battery based on the calculated direct-current inner resistance, wherein when calculating the direct-current inner resistance, at a switchover from a discharge control to a charge control or from a charge control to a discharge control over the lead storage battery, the direct-current inner resistance during a first period before the switchover and the direct-current inner resistance during a second period after the switchover and yet within a given time from the first period are calculated, and when determining the class, the class of the lead storage battery is determined based on the direct-current inner resistance during the first period before the switchover and the direct-current inner resistance during the second period after the switchover.

* * * * *